(12) United States Patent
Subramoniam (10) Patent No.: US 6,958,712 B1
(45) Date of Patent: Oct. 25, 2005

(54) LOW GATE COUNT 3GPP CHANNELIZATION CODE GENERATOR

(75) Inventor: Rajaram Subramoniam, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/644,125

(22) Filed: Aug. 20, 2003

(51) Int. Cl.$^7$ ............................................... H03M 7/00
(52) U.S. Cl. ........................................ 341/50; 341/51
(58) Field of Search ..................... 341/50, 51; 714/732, 714/733, 42, 719

(56) References Cited

U.S. PATENT DOCUMENTS 6,567,017 B2 *  5/2003  Medlock et al. .............. 341/50

* cited by examiner

Primary Examiner—Peguy JeanPierre
Assistant Examiner—Joseph Lauture
(74) Attorney, Agent, or Firm—Darby & Darby, P.C.; Matthew M. Gaffney (57) ABSTRACT

A channelization code is generated in response to a spreading factor and a code number. The code number is right justified to provide a right-justified code number. The right-justified code number is stored in an eight-bit register. An eight-bit binary counter is arranged to provide a binary count. The binary counter is reset when the binary count reaches a value equal to the spreading factor minus one. A channelization logic circuit is configured to convert the binary count and the stored right-justified code number into the channelization code. According to one example, the channelization logic circuit comprises eight AND gates and eight XOR gates. A channelization code generator circuit may be integrated into an integrated chip that has a small silicon area and low power consumption.

20 Claims, 4 Drawing Sheets

$$\begin{bmatrix} C_{ch,2,0} \\ C_{ch,2,1} \end{bmatrix} = \begin{bmatrix} C_{ch,1,0} & C_{ch,1,0} \\ C_{ch,1,0} & -C_{ch,1,0} \end{bmatrix} = \begin{bmatrix} 1 & 1 \\ 1 & -1 \end{bmatrix}$$

$$\begin{bmatrix} C_{ch,2(n+1),0} \\ C_{ch,2(n+1),1} \\ C_{ch,2(n+1),2} \\ C_{ch,2(n+1),3} \\ \vdots \\ C_{ch,2(n+1),2(n+1)-2} \\ C_{ch,2(n+1),2(n+1)-1} \end{bmatrix} = \begin{bmatrix} C_{ch,2^n,0} & C_{ch,2^n,0} \\ C_{ch,2^n,0} & -C_{ch,2^n,0} \\ C_{ch,2^n,1} & C_{ch,2^n,1} \\ C_{ch,2^n,1} & -C_{ch,2^n,1} \\ \vdots & \vdots \\ C_{ch,2^n,2^n-1} & C_{ch,2^n,2^n-1} \\ C_{ch,2^n,2^n-1} & -C_{ch,2^n,2^n-1} \end{bmatrix}$$

LOW GATE COUNT 3GPP CHANNELIZATION CODE GENERATOR

FIELD OF THE INVENTION

The present invention relates to generation of a 3GPP channelization code, and in particular, to a 3GPP channelization code generator with a low silicon area and low power consumption.

BACKGROUND OF THE INVENTION

Code division multiple access (CDMA) is a technique that allows a communications system to accommodate a large number of system users. CDMA uses a spread spectrum modulation technique, where the signal energy of each channel is spread over a wide frequency band. Multiple channels each correspond to a different system user occupying the same frequency band.

Wideband code-division multiple access (WCDMA) is based on an ITU standard derived from code-division multiple access (CDMA). WCDMA is a third-generation mobile wireless technology. WCDMA can support mobile/portable voice, images, data, and video communications at up to 2 Mbps (local area access) or 384 Kbps (wide area access). Each analog input signal is converted into a digital signal that is spread spectrum coded for transmission over a broad range of frequencies.

User devices negotiate with a base station for a particular bandwidth when the user device is ready to transmit data. The user will be assigned a spreading factor and a code number to differentiate from other users. The spreading factor is associated with allocated bandwidth, and it typically a number that is an integral power of two from 1 to 256. The bandwidth is inversely proportional to the spreading factor. The code number is a number that is less than the spreading factor.

A channelization code is generated in response to the code number and the spreading factor. The data is multiplied by the channelization code after the channelization code is generated. The data is then scrambled. The data is broadcast after the data is scrambled.

BRIEF DESCRIPTION OF THE DRAWINGS

Non-limiting and non-exhaustive embodiments of the present invention are described with reference to the following drawings.

DETAILED DESCRIPTION OF THE PREFERRED EMBODIMENT

Throughout the specification and claims, the following terms take the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal. Referring to the drawings, like numbers indicate like parts throughout the views.

Briefly stated, the invention is related to generating a channelization code in response to a spreading factor and a code number. The code number is right justified to provide a right-justified code number. The right-justified code number is stored in an eight-bit register. An eight-bit binary counter is arranged to provide a binary count. The binary counter is reset when the binary count reaches a value equal to the spreading factor minus one. A channelization logic circuit is configured to convert the binary count and the stored right-justified code number into the channelization code. According to one example, the channelization logic circuit comprises eight AND gates and eight XOR gates. A channelization code generator circuit may be integrated into an integrated chip that has a small silicon area and low power consumption.

Figure 1:
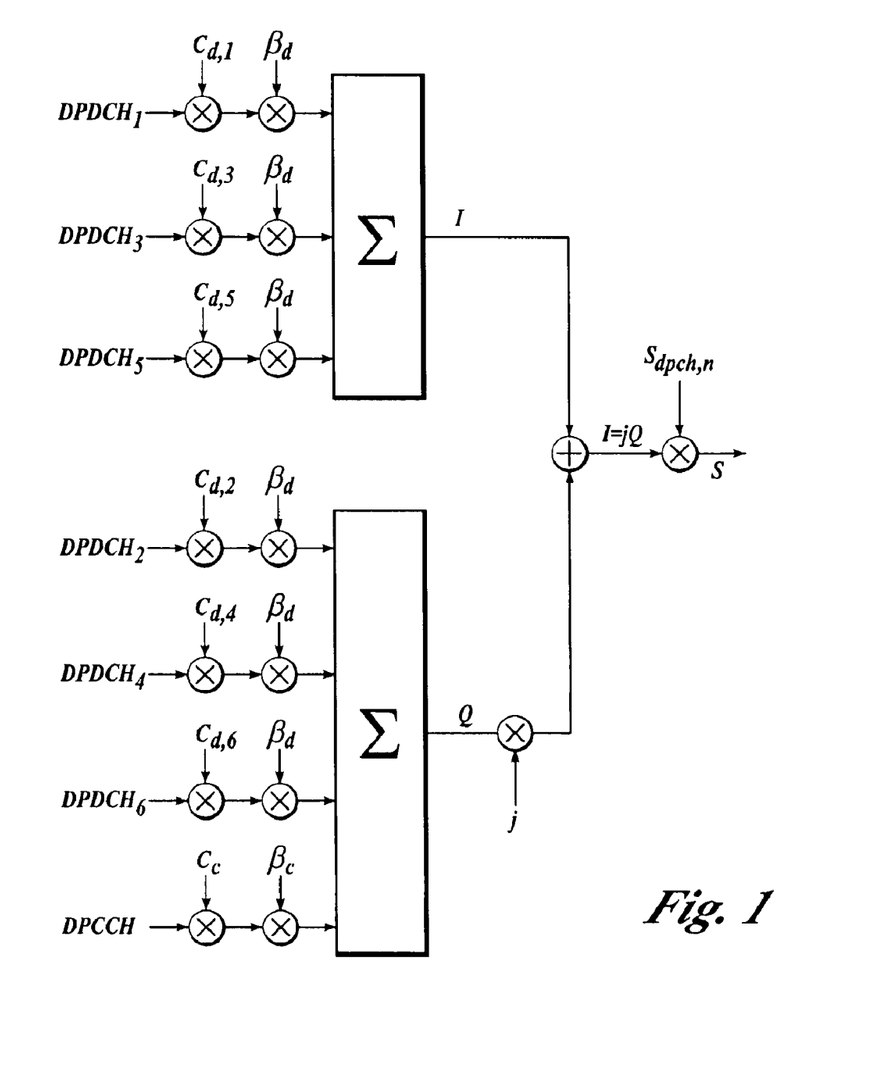
FIG. 1 illustrates a circuit for uplink modulation that is arranged in accordance with aspects of the present invention.

FIG. 1 illustrates a circuit (100) for uplink modulation. Each of a plurality of data channels (DPDCH$_1$–DPDCCH$_6$) is multiplied by a channelization code ($C_{d,1}$ through $C_{d,6}$ respectively), and a gain ($\beta_d$) is applied to each of the channels. Each of the channelization codes ($C_{d,1}$ through $C_{d,6}$) is generated by a separate channelization code generator circuit (400). A control channel (DPCCH) is multiplied by a channelization code (Cc) and a gain ($\beta$c) is applied to the control channel. Channels DPDCH$_1$, DPDCH$_3$ and DPDCH$_5$ are summed to provide signal 1, and channels DPDCH$_2$, DPDCH$_4$, DPDCH$_6$ and DPCCH are summed to provide signal Q. Signal Q is rotated by 90 degrees and summed with signal I to provide a combined signal. The combined signal is scrambled to provide a scrambled signal (S) by multiplying the combined signal by a scrambling code ($S_{dpch,n}$). The data is broadcast after the combined data from the data channels are scrambled.

Data that is broadcast via circuit 100 may be received by a mobile device via a circuit for downlink modulation (e.g. a rake receiver) (not shown). At least two channelization code generator circuits are required in the circuit for downlink modulation. One channelization code generator circuit is required for the data channel and one channelization code generator circuit is required for the control channel for a rake receiver with a single finger. Each additional data channel requires one additional channelization code generator circuit. To support 384 Kbps, there are 3 data channels and one control channel for each finger. For optimal performance, the rake receiver has 6–8 fingers.

Figure 2:
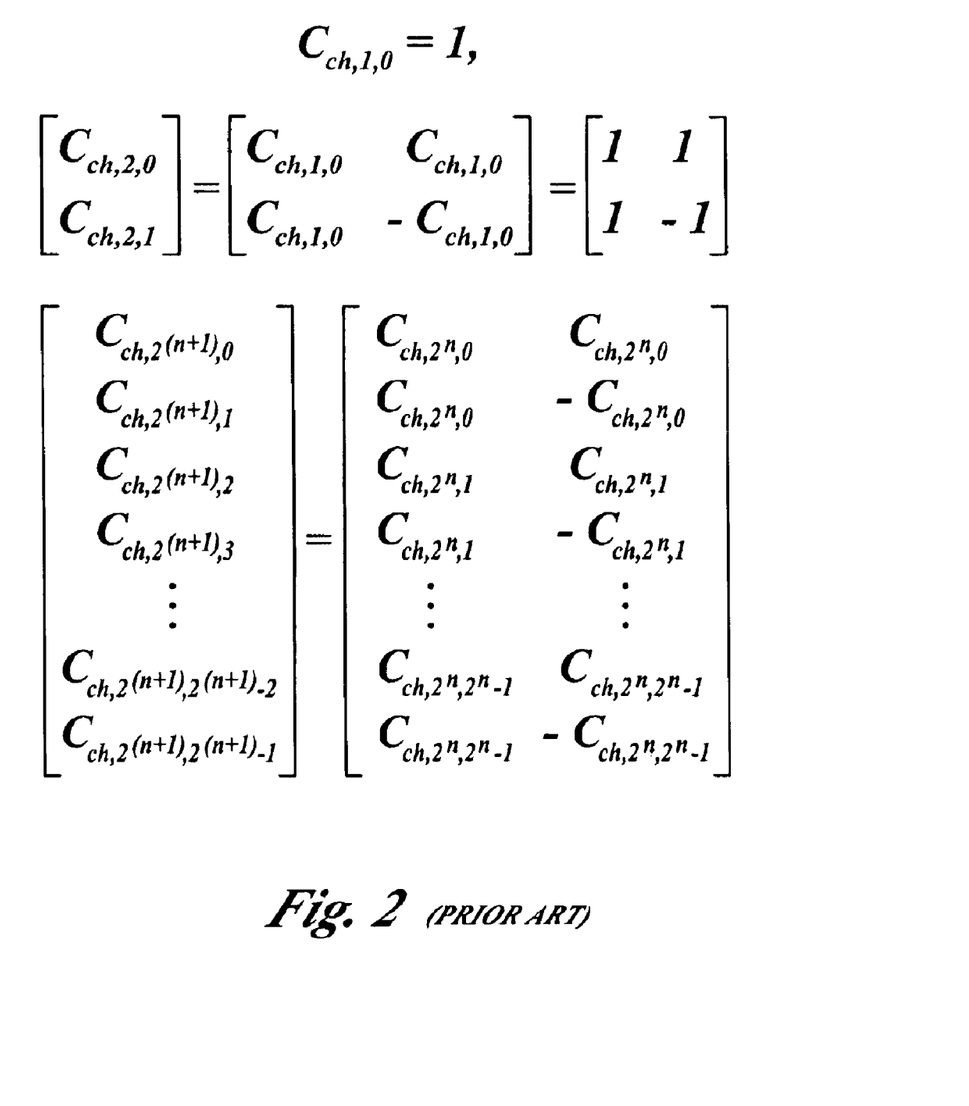
FIG. 2 illustrates the 3GPP definition of a channelization code in the form of a matrix.
Figure 3:
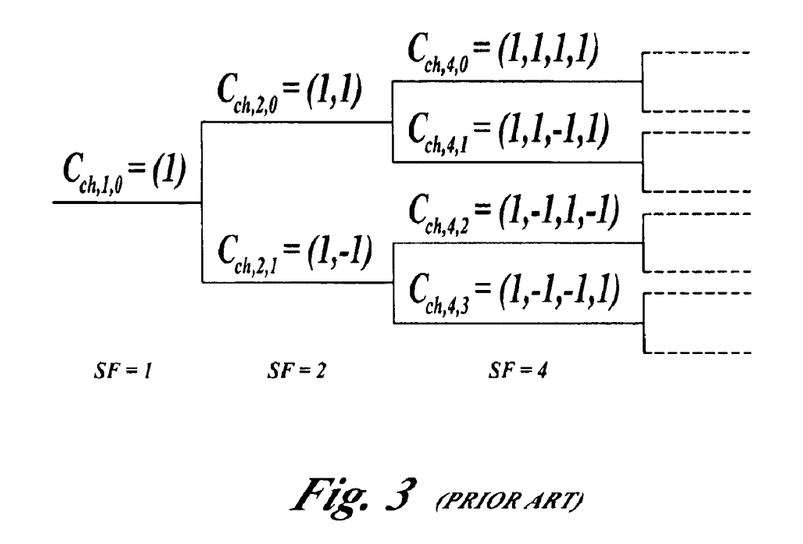
FIG. 3 illustrates the 3GPP definition of a channelization code in the form of a code tree.

FIG. 2 illustrates the 3GPP definition of a channelization code in the form of a matrix. FIG. 3 illustrates the 3GPP definition of a channelization code in the form of a code tree.

A channelization code may be expressed as $C_{ch,SF,k}$, where SF is the spreading factor and k is the code number. The channelization code contains a set of elements, where the number of elements in the set is equal to the spreading factor. Each element of the channelization code consists of either 1 or −1. By definition, $C_{ch,1,0}$ has a single element, 1. $C_{ch,2,0}$ has two elements (1,1), and $C_{ch,4,2}$ has four elements (1, −1, 1, −1). The elements of a channelization code can be determined using the definition in FIG. 2, or using the code tree in FIG. 3.

The code tree illustrated in FIG. 3 may be used as follows. Progression from left to right leads to the next SF, where the SFs progress as integral powers of two (1, 2, 4, . . . , 128, 256). Progression from top to bottom leads to the next code number (from 0 to SF-1). Progressing from left to right, each branch (the parent branch) branches into two separate branches (the descendant braches). The elements that comprises the first half of the elements of each branch are identical to the elements of the parent branch. For example, the parent branch for $C_{ch,2,0}$=(1,1) divides into descendant branches $C_{ch,4,0}$=(1,1,1,1) and $C_{ch,4,1}$=(1,1,−1-1). The first two elements of $C_{ch,4,0}$ and $C_{ch,4,1}$ are identical to the elements of $C_{ch,2,0}$. The elements that comprise the second half of the top descendent branch are also identical to the elements of the parent branch. For example, $C_{ch,2,0}$=(1,1) and $C_{ch,4,0}$=(1,1,1,1). The last two elements of $C_{ch,4,0}$ are identical to the elements of $C_{ch,2,0}$. Each of the elements that comprise the second half of the bottom descendent branch is the inverse of the corresponding element in the parent branch. For example, $C_{ch,2,0}$=(1,1) and $C_{ch,4,1}$=(1,1,−1,−1). The third element of $C_{ch,4,1}$ is the inverse of the first element in $C_{ch,2,0}$, and the last element of $C_{ch,4,1}$ is the inverse of the last element in $C_{ch,2,0}$.

Figure 4:
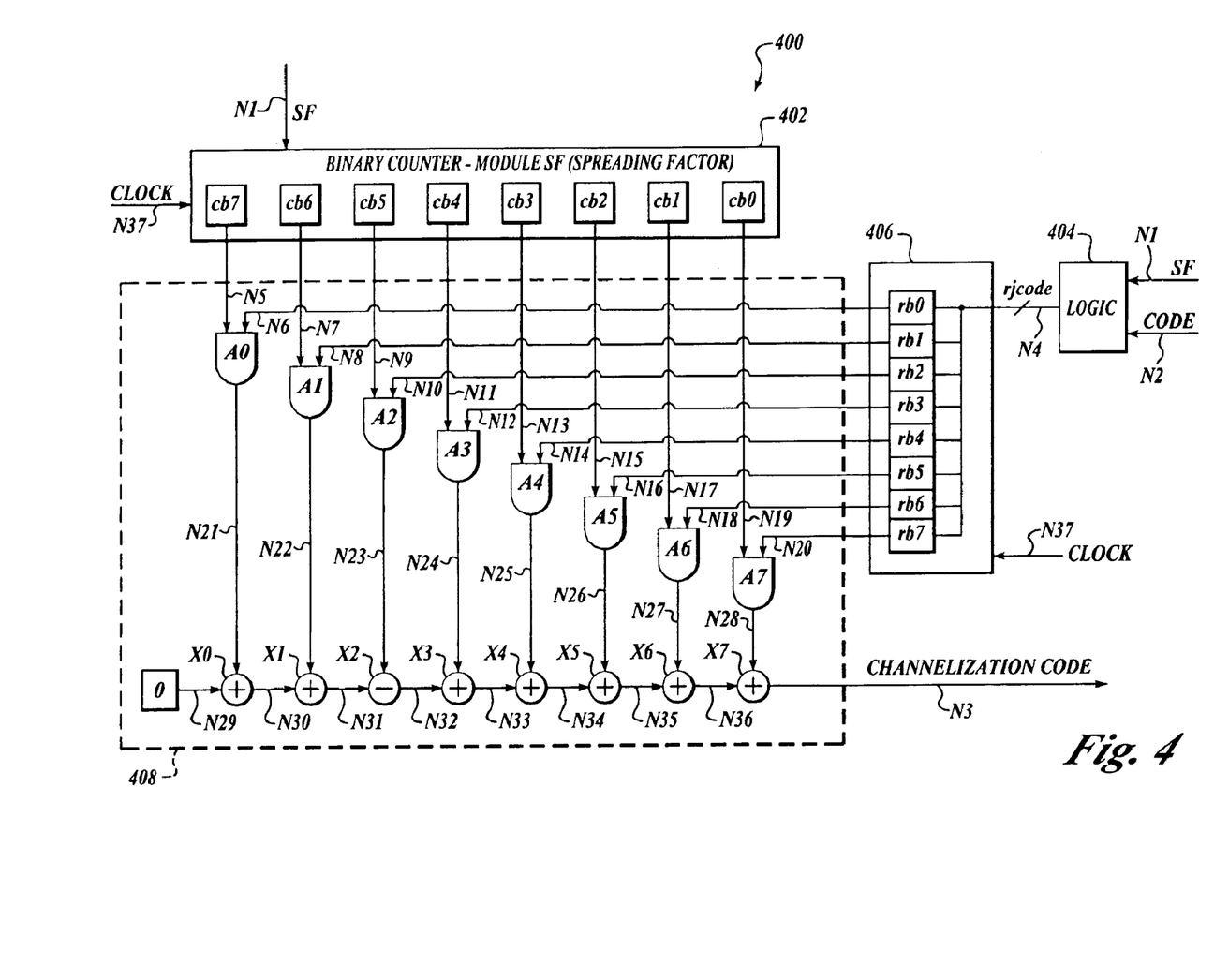
FIG. 4 illustrates a channelization code generator circuit that is arranged in accordance with aspects of the present invention.

FIG. 4 illustrates a channelization code generator circuit (400) that is arranged in accordance with aspects of the present invention. Circuit 400 comprises a binary counter circuit (402), a code logic circuit (404), a register circuit (406), and a channelization logic circuit (408). According to one example, channelization logic circuit 408 includes a plurality of AND gates (A0–A7) and a plurality of XOR gates (X0–X7).

Binary counter circuit 402 has a first input that is coupled to node N1, a second input that is coupled to node N37, and an eight-bit output. Each bit of the output (b0–b7) of binary counter circuit 402 is coupled to a respective one of nodes N19, N17, N15, N13, N11, N9, N7, and N5. Code logic circuit 404 has a first input that is coupled to node N1, a second input that is coupled to node N2, and an eight-bit output that is coupled to node N4. Register circuit 406 has an input that is coupled to node N4, and an eight-bit output. Each bit of the eight-bit output (b0–b7) of register circuit 406 is coupled to a respective one of nodes N6, N8, N10, N12, N14, N16, N18, and N20.

AND gate A0 has a first input that is coupled to node N5, a second input that is coupled to node N6, and an output that is coupled to node N21. AND gate A1 has a first input that is coupled to node N7, a second input that is coupled to node N8, and an output that is coupled to node N22. AND gate A2 has a first input that is coupled to node N9, a second input that is coupled to node N10, and an output that is coupled to node N23. AND gate A3 has a first input that is coupled to node N11, a second input that is coupled to node N12, and an output that is coupled to node N24. AND gate A4 has a first input that is coupled to node N13, a second input that is coupled to node N14, and an output that is coupled to node N25. AND gate A5 has a first input that is coupled to node N15, a second input that is coupled to node N16, and an output that is coupled to node N26. AND gate A6 has a first input that is coupled to node N17, a second input that is coupled to node N18, and an output that is coupled to node N27. AND gate A7 has a first input that is coupled to node N19, a second input that is coupled to node N20, and an output that is coupled to node N28.

XOR gate X0 has a first input that is coupled to node N21, a second input that is coupled to node N29, and an output that is coupled to node N30. XOR gate X1 has a first input that is coupled to node N22, a second input that is coupled to node N30, and an output that is coupled to node N31. XOR gate X2 has a first input that is coupled to node N23, a second input that is coupled to node N31, and an output that is coupled to node N32. XOR gate X3 has a first input that is coupled to node N24, a second input that is coupled to node N32, and an output that is coupled to node N33. XOR gate X4 has a first input that is coupled to node N25, a second input that is coupled to node N33, and an output that is coupled to node N34. XOR gate X5 has a first input that is coupled to node N26, a second input that is coupled to node N34, and an output that is coupled to node N35. XOR gate X6 has a first input that is coupled to node N27, a second input that is coupled to node N35, and an output that is coupled to node N36. XOR gate X7 has a first input that is coupled to node N28, a second input that is coupled to node N36, and an output that is coupled to node N3.

Binary counter circuit 402 and code logic circuit 404 are each configured to receive a spreading factor signal at node N1. According to one example, the spreading factor signal is an eight-bit binary signal that corresponds to SF. Binary counter circuit 402 is further configured to receive a clock signal at node N37. Code logic circuit 404 is further configured to receive a code number signal (code) at node N2. XOR gate X0 is configured to receive a signal that corresponds to a logical level of zero at node N29.

Binary counter circuit 402 is illustrated as an eight-bit binary counter. The binary counter circuit (402) is arranged as a modulo SF binary counter. The binary counter circuit (402) counts from 0 to SF-1 in response to the clock signal. The binary counter circuit (402) rolls back to 0 the next clock after the count reaches SF-I. Binary counter circuit 402 is configured to provide the binary count as a binary count signal at the output of binary counter circuit 402.

Code logic circuit 404 is arranged to provide a right justified code number signal (rjcode) in response to the SF signal and the code number signal (code).

Code logic circuit 404 is arranged to evaluate the number of valid bits in the code number according to the SF. The number of valid bits (N) is equal to $\log_2$ (SF). For example, an SF of 2 corresponds to one valid bit, an SF of 4 corresponds to two valid bits, and an SF of 8 corresponds to three valid bits. The most significant valid bit from the code number signal (code) is moved to the bit 7 position of the right justified code number signal (rjcode). All bits other than the N most significant bits are adjusted to zero.

For example, rjcode corresponds to 01100000 when the channelization code corresponds to $C_{ch,8,3}$. In this example, three bits are used since the SF is 8, the code number corresponds to 011, and the most significant bit is adjusted to bit 7, so that bits 7, 6, and 5 corresponds to 0, 1, and 1 respectively. All bits other than the three most significant bits are adjusted to zero.

Register circuit 406 is arranged to store the right-justified code number. Register circuit 406 is configured to provide the stored right-justified code number as a stored code number signal at the output of register circuit 406.

Channelization logic circuit 408 is configured to provide the channelization code signal in response to the stored code number signal and the binary count signal. Channelization logic circuit 408 is configured to provide the channelization code signal in a serial manner. The first element of the channelization code is generated at a first clock pulse (i.e. when the binary count corresponds to zero). Each subsequent element of the channelization code is generated at each subsequent clock pulse (i.e. when the binary count increments). Channelization logic circuit 408 provides the first element of the channelization code again after all of the elements of the channelization code have been generated (i.e. when the binary count has reset to zero after reaching SF-I). A digital value of 0 corresponds to a channelization code element of "−1", while a digital value of 1 corresponds to a channelization code element of "1".

According to a further example, binary counter circuit 402 includes a digital comparator that is configured to compare the binary count to SF-1. According to this example, an output of the digital comparator is coupled to a reset input of the binary counter such that the binary counter is reset to 0 when the binary count corresponds to SF-1.

According to one example, binary counter circuit 402 is configured to receive a frame reset signal. The binary counter is reset to 0 when either the frame reset signal corresponds to an active level or the signal provided by the digital comparator output corresponds to an active level. For example, binary counter circuit 402 may further include an OR gate having a first input, a second input, and an output. The first input is configured to receive the frame reset signal, the second input is coupled to the output of the digital comparator, and the output of the OR gate is coupled to the reset input.

According to an alternative example, binary counter circuit 402 does not receive a frame reset signal. Circuit 400 is configured to receive signals code, clock, and SF such that the binary count always corresponds to zero after the next clock when the code number or the SF changes.

An example of generation of the channelization code for $C_{ch,2,1}$ proceeds as follows. Code logic circuit 404 provides signal rjcode as 10000000 in response to the SF signal (which corresponds to 2) and the code number signal (which corresponds to 1). Register circuit 406 stores 10000000 as the stored code number in response to the next clock. Initially, the binary count corresponds to 00000000. The voltages at nodes N21–N27 each correspond to a logical level of zero, because bits 1–7 of the binary count signal each correspond to 0 and bits 0–6 of the stored code number signal each correspond to zero. AND gate A7 provides a voltage that corresponds to a logical level of zero at node N28, since bit 0 of the binary count signal corresponds to 0. The voltage at node N3 corresponds to a logical level of zero since both inputs of each of the XOR gates X0–X7 correspond to zero. The first element of the channelization code is generated as "1" since the logical level associated with the voltage at node N3 corresponds to zero.

The binary count increments from 00000000 to 00000001 in response to the clock signal. The voltage at nodes N21–N27 and N36 each correspond to a logical level of zero since bits 1–7 of the binary count signal and bits 0–6 of the stored code number signal are unchanged since the previous clock. AND gate A7 provides a voltage that corresponds to a logical level of one at node N28, since bit 0 of the binary count signal corresponds to 1 and bit 7 of the stored code number corresponds to 1. XOR gate X7 provides a voltage that corresponds to a logical level of 1 at node N3, since the voltage at node N28 corresponds to a logical level of 1 and the voltage at node N37 corresponds to a logical level of 0. The second element of the channelization code is generated as "−1" since the logical level of the voltage at node N3 corresponds to 1. The binary count returns to 00000000 after the next clock, and the process repeats until a new code number is received.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. An apparatus for generating a channelization code, comprising:
   a binary counter circuit that is arranged to: receive a spreading factor signal and a clock signal, provide a binary count signal that is responsive to the clock signal, and reset the binary counter circuit when the binary count signal reaches a limit number that is associated with a spreading factor, wherein the spreading factor is associated with the spreading factor signal;
   a code logic circuit that is arranged to: receive a code number signal and the spreading factor signal, and provide a right-justified code signal in response to the code number signal and the spreading factor signal, wherein the right-justified code signal corresponds to a right justified version of the code number signal;
   a register circuit that is arranged to: receive the right-justified code signal and the clock signal, store the right-justified code signal in response to the clock signal, and provide the stored right-justified code signal as a stored code signal; and
   a channelization logic circuit that is arranged to: receive the stored code signal and the binary count signal, and provide the channelization code in response to the stored code signal and the binary count signal such that the channelization code is associated with the code number and the spreading factor.

2. The apparatus of claim 1, wherein the register circuit comprises a plurality of flip-flops, and wherein each of the plurality of flip-flops is configured to store one bit of the right-justified code number signal.

3. The apparatus of claim 1, wherein the binary counter circuit comprises a binary counter and a digital comparator, an output of the digital comparator is coupled to a reset input of the binary counter, and wherein the digital comparator is configured to compare the binary count to the limit number.

4. The apparatus of claim 1, wherein the binary counter circuit comprises a binary counter, a digital comparator, and an OR gate, the OR gate has a first OR input, a second OR input, and an OR output, the digital comparator has a comparator output, the digital comparator is configured to compare the binary count to the limit number, the comparator output is coupled to the first OR input, the OR gate is configured to receive a frame reset signal at the second OR input, the frame reset signal is active when at least one of the code number and the spreading factor changes, and wherein the OR output is coupled to a reset input of the binary counter, such that the binary counter is reset when the frame reset signal is active or the binary count reaches the limit number.

5. The apparatus of claim 1, wherein the binary counter circuit has a counter output, the binary counter circuit is configured to provide the binary count signal at the counter output, the counter output has a number of bits that is equal to a first number, the register circuit has a register output, the register circuit is configured to provide the stored code number at the register output, and wherein the register output has a number of bits that is equal to the first number.

6. The apparatus of claim 5, wherein the channelization logic circuit comprises a number of logic gates that is approximately equal to twice the first number.

7. The apparatus of claim 5, wherein the channelization logic circuit comprises a plurality of AND gate circuits, the channelization logic circuit further comprises a plurality of XOR gate circuits, the number of the plurality of AND gate circuits corresponds to the first number, and the number of the plurality of XOR gate circuits corresponds to the first number.

8. The apparatus of claim 7, wherein each of the plurality of AND gate circuits has a first input, a second input, and an output, each of the plurality of AND gate circuits is configured to provide an AND output signal at the output of the AND gate circuit in response to a signal that is provided at the first input of the AND gate circuit and the second input of the AND gate circuit, each of the plurality of XOR gate circuits has a first input, a second input, and an output, each of the plurality of XOR gate circuits is configured to provide an XOR output signal at the output of the XOR gate circuit in response to a signal that is provided at the first input of the XOR gate circuit and the second input of the XOR gate circuit, the output of each AND gate circuit is coupled to first input of a corresponding XOR gate circuit, the first XOR gate circuit is configured to provide the channelization code at the output of the first XOR gate circuit, the output of each of the XOR gate circuits other than the first XOR gate circuit is coupled to the second input of the previous XOR gate circuit, the first input of the first of the plurality of AND gate circuits is coupled to a least significant bit of the counter output, the second input of the first of the plurality of AND gate circuits is coupled to a most significant bit of the register output, the first input of each subsequent AND gate circuit of the plurality of AND gate circuits is coupled to a next least significant bit of the counter output, and the second input of each subsequent AND gate circuit of the plurality of AND gate circuits is coupled to a next most significant bit of the register output.

9. The apparatus of claim 5, wherein the first number is eight such that the counter output comprises a counter bit 0, a counter bit 1, a counter bit 2, a counter bit 3, a counter bit 4, a counter bit 5, a counter bit 6, and a counter bit 7 such that the counter bit 7 is the most significant bit and the counter bit 0 is the least significant bit of the counter output, and wherein the register output comprises a register bit 0, a register bit 1, a register bit 2, a register bit 3, a register bit 4, a register bit 5, a register bit 6, and a register bit 7 such that the register bit 7 is the most significant bit and the register bit 0 is the least significant bit of the register output.

10. The apparatus of claim 9, wherein the channelization logic circuit comprises:

a first AND gate having a first input, a second input, and an output, wherein the first input is coupled to the counter bit 7 and the second input is coupled to the register bit 0;

a second AND gate having a first input, a second input, and an output, wherein the first input of the second AND gate is coupled to the counter bit 6 and the second input of the second AND gate is coupled to the register bit 1;

a third AND gate having a first input, a second input, and an output, wherein the first input of the third AND gate is coupled to the counter bit 5 and the second input of the third AND gate is coupled to the register bit 2;

a fourth AND gate having a first input, a second input, and an output, wherein the first input of the fourth AND gate is coupled to the counter bit 4 and the second input of the fourth AND gate is coupled to the register bit 3;

a fifth AND gate having a first input, a second input, and an output, wherein the first input of the fifth AND gate is coupled to the counter bit 3 and the second input of the fifth AND gate is coupled to the register bit 4;

a sixth AND gate having a first input, a second input, and an output, wherein the first input of the sixth AND gate is coupled to the counter bit 2 and the second input of the sixth AND gate is coupled to the register bit 5;

a seventh AND gate having a first input, a second input, and an output, wherein the first input of the seventh AND gate is coupled to the counter bit 1 and the second input of the seventh AND gate is coupled to the register bit 6;

a eighth AND gate having a first input, a second input, and an output, wherein the first input of the eighth AND gate is coupled to the counter bit 0 and the second input of the eighth AND gate is coupled to the register bit 7;

a first XOR gate having a first input, a second input, and an output, wherein the first input of the first XOR gate is configured to receive a signal having a voltage that corresponds to a logical level of zero, and the second input of the first XOR gate is coupled to the output of the first AND gate;

a second XOR gate having a first input, a second input, and an output, wherein the first input of the second XOR gate is coupled to the output of the first XOR gate, and the second input of the second XOR gate is coupled to the output of the second AND gate;

a third XOR gate having a first input, a second input, and an output, wherein the first input of the third XOR gate is coupled to the output of the second XOR gate, and the second input of the third XOR gate is coupled to the output of the third AND gate;

a fourth XOR gate having a first input, a second input, and an output, wherein the first input of the fourth XOR gate is coupled to the output of the third XOR gate, and the second input of the fourth XOR gate is coupled to the output of the fourth AND gate;

a fifth XOR gate having a first input, a second input, and an output, wherein the first input of the fifth XOR gate is coupled to the output of the fourth XOR gate, and the second input of the fifth XOR gate is coupled to the output of the fifth AND gate;

a sixth XOR gate having a first input, a second input, and an output, wherein the first input of the sixth XOR gate is coupled to the output of the fifth XOR gate, and the second input of the sixth XOR gate is coupled to the output of the sixth AND gate;

a seventh XOR gate having a first input, a second input, and an output, wherein the first input of the seventh XOR gate is coupled to the output of the sixth XOR gate, and the second input of the seventh XOR gate is coupled to the output of the seventh AND gate;

a eighth XOR gate having a first input, a second input, and an output, wherein the first input of the eighth XOR gate is coupled to the output of the seventh XOR gate, the second input of the eighth XOR gate is coupled to the output of the eighth AND gate, and wherein the output of the eighth XOR gate corresponds to the channelization code output.

11. An apparatus for generating a channelization code, comprising:

a binary counter circuit that is arranged to: receive a spreading factor signal and a clock signal, provide a binary count signal that is responsive to the clock signal, and reset the binary counter circuit when the binary count signal reaches a limit number that is associated with a spreading factor, wherein the spreading factor is associated with the spreading factor signal, wherein the limit number is equal to the spreading factor minus one;

a code logic circuit that is arranged to: receive a code number signal and the spreading factor signal, and provide a right-justified code signal in response to the code number signal and the spreading factor signal, wherein the right-justified code signal corresponds to a right justified version of the code number signal;

a register circuit that is arranged to: receive the right-justified code signal and the clock signal, store the right-justified code signal in response to the clock signal, and provide the stored right-justified code signal as a stored code signal; and a channelization logic circuit that is arranged to: receive the stored code signal and the binary count signal, and provide the channelization code in response to the stored code signal and the binary count signal such that the channelization code is associated with the code number and the spreading factor.

12. A method for producing a channelization code in response to a spreading factor and a code number, the method comprising:

comparing a binary count to a limit number;

incrementing the binary count in response to a clock signal when the binary count is less than the limit number;

resetting the binary count when the binary count is equal to the limit number, wherein the limit number is related to the spreading factor;

evaluating a code number and the spreading factor;

right justifying the code number based on the spreading factor;

storing the right-justified code number as a stored code number; and logically calculating the channelization code in response to the binary count and the stored code number.

13. The method of claim 12, wherein right-justifying the code number comprises:

determining a number of valid bits of the code number, wherein the number of valid bits of the code number corresponds to the base two logarithm of the spreading factor, and wherein the code number is a binary number;

setting the most significant bit of the right-justified code number to the most significant valid bit of the code number;

for each remaining valid bit of the code number, setting the next most significant bit of the right-justified code number to the next most significant valid bit of the code number; and setting the remaining bits of the right-justified code number to zero.

14. The method of claim 12, wherein the binary count comprises a number of bits that is equal to a first number, the stored code number comprises a number of bits that is equal to the first number, and wherein logically calculating the channelization code comprises:

providing a first of a plurality of AND signals, wherein the first of the plurality of AND signals is provided such that the fist of the plurality of AND signals corresponds to a logical level of one when a first condition is satisfied and the first of the plurality of AND signals corresponds to a logical level of zero when the first condition is not satisfied, and wherein the first condition is satisfied when a most significant bit of the binary count and the least significant bit of the stored code number both correspond to zero;

providing each subsequent AND signal of the plurality of AND signals, wherein each subsequent AND signal of the plurality of AND signals is provided such that the next of the plurality of AND signals corresponds to a logical level of one when a next condition is satisfied and the next of the plurality of AND signals corresponds to a logical level of zero when the next condition is not satisfied, and wherein the next condition is satisfied when a next most significant bit of the binary count and the next least significant bit of the stored code number both correspond to zero;

providing a first of a plurality of XOR signals, wherein the first of the plurality of XOR signals is provided such that the first of the plurality of XOR signals corresponds to a logical level of one when a first XOR condition is satisfied and the first of the plurality of XOR signals corresponds to a logical level of zero when the first XOR condition is not satisfied, and wherein the first XOR condition is satisfied when the first of the plurality of AND signals corresponds to a logical level of one;

providing a next of the plurality of XOR signals, wherein the next of the plurality of XOR signals is provided such that the next of the plurality of XOR signals corresponds to a logical level of one when a next XOR condition is satisfied and the next of the plurality of XOR signals corresponds to a logical level of zero when the next XOR condition is not satisfied, the next XOR condition is satisfied when the next of the plurality of AND signals and the previous XOR signal each correspond to different logical levels, and wherein the last of the plurality of XOR signals corresponds to the channelization code.

15. A method for producing a channelization code in response to a spreading factor and a code number, the method comprising:

comparing a binary count to a limit number;

incrementing the binary count in response to a clock signal when the binary count is less than the limit number;

resetting the binary count when the binary count is equal to the limit number, wherein the limit number is related to the spreading factor;

evaluating a code number and the spreading factor, wherein the limit number is equal to the spreading factor minus one;

evaluating a code number and the spreading factor;

right justifying the code number based on the spreading factor;

storing the right-justified code number as a stored code number; and logically calculating the channelization code in response to the binary count and the stored code number.

16. An apparatus for generating a channelization code in response to a spreading factor and a code number, the apparatus comprising:

a means for counting that is configured to provide a binary count;

a means for resetting that is configured to reset the binary count when the binary count signal reaches a limit number, wherein the limit number corresponds to the spreading factor minus one;

a means for right justifying, wherein the means for right justifying is configured to right justify the code number in response to the spreading factor to provide a right-justified code number;

a means for storing, wherein the means for storing is configured to store the right-justified code number as a stored code number; and a means for logically calculating that is configured to logically calculate the channelization code in response to the binary count and the stored code number.

17. An apparatus for generating a channelization code in response to a spreading factor and a code number, the apparatus comprising:

a means for counting that is configured to provide a binary count;

a means for resetting that is configured to reset the binary count when the binary count signal reaches a limit number;

a means for right justifying, wherein the means for right justifying is configured to right justify the code number in response to the spreading factor to provide a right-justified code number;

a means for storing, wherein the means for storing is configured to store the right-justified code number as a stored code number, wherein the limit number corresponds to the spreading factor minus one, wherein the binary count comprises a number of bits that is equal to a first number, and wherein the stored code number has a number of bits that is equal to the first number; and a means for logically calculating that is configured to logically calculate the channelization code in response to the binary count and the stored code number.

18. The apparatus of claim 17, wherein the means for logically calculating comprises logic gates, and wherein the number of logic gates is approximately equal to a second number, wherein the second number is twice the first number.

19. The apparatus of claim 17, wherein the means for logically calculating comprises a plurality of means for providing an AND function, the means for logically calculating further comprises a plurality of means for providing an XOR function, the number of the plurality of means for providing an AND function corresponds to the first number, and the number of the plurality of means for providing an XOR function corresponds to the first number.

20. The apparatus of claim 19, wherein each of the plurality of means for providing an AND function has a first input, a second input, and an output, each of the plurality of means for providing an AND function is configured to provide an AND output signal at the output of the means for providing an AND function in response to a signal that is provided at the first input of the means for providing an AND function and the second input of the means for providing an AND function, each of the plurality of means for providing an XOR function has a first input, a second input, and an output, each of the plurality of means for providing an XOR function is configured to provide an XOR output signal at the output of the means for providing an XOR function in response to a signal that is provided at the first input of the means for providing an XOR function and the second input of the means for providing an XOR function, the output of each means for providing an AND function is coupled to first input of a corresponding means for providing an XOR function, a first means for providing an XOR function of the plurality of means for providing an XOR function is configured to provide the channelization code at the output of the first means for providing an XOR function, the output of each of the means for providing an XOR function other than the first means for providing an XOR function is coupled to the second input of the previous means for providing an XOR function, the first input of the first of the plurality of means for providing an AND function is configured to receive a least significant bit of the binary count, the second input of the first of the plurality of means for providing an AND function is configured to receive a most significant bit of the stored code number, the first input of each subsequent means for providing an AND function of the plurality of means for providing an AND function is configured to receive a next least significant bit of the binary count, and the second input of each subsequent means for providing an AND function of the plurality of means for providing an AND function is configured to receive a next most significant bit of the stored code number.

* * * * *

UNITED STATES PATENT AND TRADEMARK OFFICE
CERTIFICATE OF CORRECTION

PATENT NO. : 6,958,712 B1  
DATED : October 25, 2005  
INVENTOR(S) : Rajaram Subramoniam Page 1 of 1

It is certified that error appears in the above-identified patent and that said Letters Patent is hereby corrected as shown below:

Column 2,  
Line 38, after "signal" delete "1", and insert -- I, --.

Column 4,  
Line 33, after "reaches" delete "SF-I" and insert -- SF-1 --.  
Lines 40-48, delete "Code logic circuit 404 is arranged to evaluate the number of valid bits in the code number according to the SF. The number of valid bits (N) is equal to $\log_2$ (SF). For example, an SF of 2 corresponds to one valid bit, an SF of 4 corresponds to two valid bits, and an SF of 8 corresponds to three valid bits. The most significant valid bit from the code number signal (code) is moved to the bit 7 position of the right justified code number signal (rjcode). All bits other than the N most significant bits are adjusted to zero." and insert the same in Col. 4, line 39, after "(code).".

Column 5,  
Line 6, delete "SF-I" and insert -- SF-1 --.

Column 9,  
Line 63, delete "fist" and insert -- first --.

Signed and Sealed this

Fourteenth Day of March, 2006

JON W. DUDAS  
*Director of the United States Patent and Trademark Office*